United States Patent
Rastello et al.

(10) Patent No.: US 7,586,993 B2
(45) Date of Patent: Sep. 8, 2009

(54) INTERLEAVER MEMORY SELECTABLY RECEIVING PN OR COUNTER CHAIN READ ADDRESS

(75) Inventors: Peter Rastello, Vista, CA (US); John G. McDonough, La Jolla, CA (US)

(73) Assignee: Texas Instruments Incorporated, Dallas, TX (US)

( * ) Notice: Subject to any disclaimer, the term of this patent is extended or adjusted under 35 U.S.C. 154(b) by 796 days.

(21) Appl. No.: 10/007,087

(22) Filed: Dec. 6, 2001

(65) Prior Publication Data

US 2003/0108086 A1 Jun. 12, 2003

(51) Int. Cl.
*H04L 27/00* (2006.01)

(52) U.S. Cl. .................. 375/295; 714/702; 714/763

(58) Field of Classification Search ............. 375/130, 375/140, 295, 372, 367; 332/185; 711/5, 711/100, 157, 200; 710/52, 53; 714/702, 714/763

See application file for complete search history.

(56) References Cited

U.S. PATENT DOCUMENTS

| | | | |
|---|---|---|---|
| 5,572,532 A * | 11/1996 | Fimoff et al. ............... 714/702 |
| 6,346,896 B1 * | 2/2002 | Su et al. ...................... 341/81 |
| 6,392,572 B1 * | 5/2002 | Shiu et al. .................... 341/81 |
| 6,591,381 B1 * | 7/2003 | Kim et al. .................... 714/701 |
| 6,598,202 B1 * | 7/2003 | Kim et al. .................... 714/786 |
| 6,618,826 B1 * | 9/2003 | Chen et al. ................... 714/718 |
| 6,668,343 B1 * | 12/2003 | Kim et al. .................... 714/702 |
| 6,925,592 B2 * | 8/2005 | Inoue et al. .................. 714/787 |
| 2002/0170016 A1 * | 11/2002 | Inoue et al. .................. 714/787 |
| 2003/0012290 A1 * | 1/2003 | Fimoff et al. ................ 375/265 |
| 2005/0071729 A1 * | 3/2005 | Kim ............................ 714/755 |

* cited by examiner

*Primary Examiner*—Jean B Corrielus
(74) *Attorney, Agent, or Firm*—Lawrence J. Bassuk; W. James Brady; Frederick J. Telecky, Jr.

(57) ABSTRACT

A method and apparatus for interleaving multiple frames of data as disclosed provide for an extremely streamlined approach to achieving both methods of interleaving as defined in the IS-2000 standard while meeting the complex requirement of frame puncturing. Output addressing is directly driven by a PN index or a counter locked to the reverse link timing, it is a simple manner of range selection to achieve all possible configurations required in the IS-2000 standard. Puncturing of sub-20 ms frames is also easily accomplished by using a single contiguous memory and interleaver engine that resides in the input side of the interleaver memory.

4 Claims, 4 Drawing Sheets

INTERLEAVER MEMORY SELECTABLY RECEIVING PN OR COUNTER CHAIN READ ADDRESS

TECHNICAL FIELD

This invention relates in general to the field of radio communications and more specifically to a method and apparatus for interleaving multiple frames of data.

BACKGROUND

In modern Direct Sequence Spread Spectrum (DSSS) modulators, data is convolutionally or turbo encoded, punctured, and interleaved prior to transmission. The Telecommunication Industry Association (TIA) IS-2000 standard outlines two interleaving requirements, one for backward compatibility with previous DSSS standards, and a second for newly introduced data rates and channel structures. The IS-2000 standard also requires puncturing of 20 millisecond (ms) frames with 5 ms or 10 ms frames.

"Puncturing" in the current context means replacing some portion of a 20 ms frame with a shorter length (5 ms or 10 ms) frame. The portion may be any one of the four possible quadrants of a 20 ms frame (5 ms puncturing), or one of either the first or the second halves of a 20 ms frame (10 ms puncturing). In either case, more than one interleaver configuration must be employed (one for the original 20 ms frame and one for the punctured frame). The interleaving mechanism for IS-2000 is given in the standard as a read-address generator, implying the function would be implemented at the output or "read" side of the interleaver memory. Doing this would cause the output address control circuitry to be unnecessarily complex since one interleaving engine with a dedicated memory per data channel would be necessary to accomplish the puncturing.

IS95 interleaver designs include a two-stage approach for interleaving data. First a write function is used to place data in memory, then a specialized read function is used to access the data for transmission. A traditional modulator 100 configuration is shown in FIG. 1. A write address generator 102 is used to place data in memory 106, while a read address generator 104 is used to access data from memory 106.

The modulator architecture shown in FIG. 1 may work for the IS-2000 standard, but substantial control circuitry will be required to orchestrate the puncturing of sub-20 ms frames on the output side of the memory. The IS-2000 complexity is increased because multiple interleaver engines are needed to build individual channels when puncturing of 20 msec frames occurs. A need thus exists in the art for a method and apparatus that can handle transmission data in the modulator and that can support a variety of interleaver structures and perform efficient puncturing of frames.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
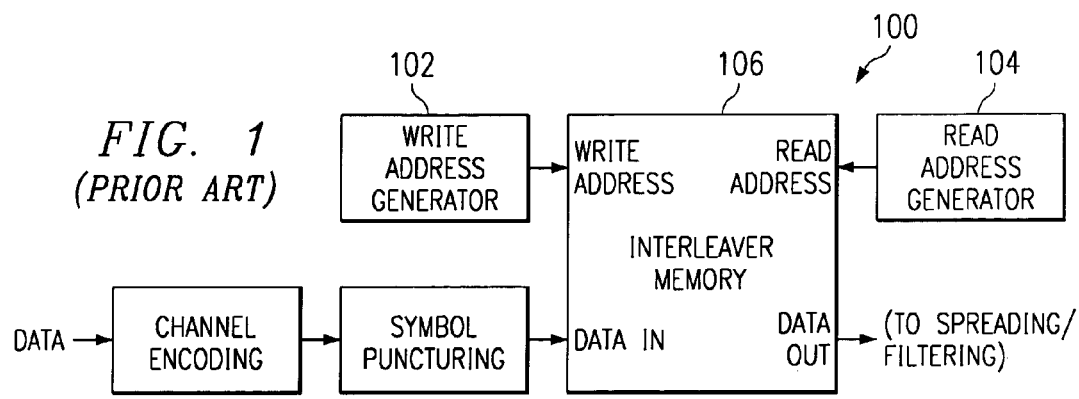
FIG. 1 shows a prior art modulator.

While the specification concludes with claims defining the features of the invention that are regarded as novel, it is believed that the invention will be better understood from a consideration of the following description in conjunction with the drawing figures, in which like reference numerals are carried forward.

The present invention provides for a seamless solution to the punctured frame requirement of the IS-2000 standard while providing for a simplified hardware flow for interleaving. The invention also provides for a flexible method for allocating multiple reverse link channels, each of programmable size within a single interleaver memory. A PN index in the addressing of the interleaver memory for the transfer of data to the spreading/filtering unit is utilized which allows for leveraging the PN index and thereby simplifying the overall design.

All interleaving is done on the input side of the memory by "inverting" the process in the case of IS-2000 interleaving, and combining the output portion within the input portion, in the case of the IS-95 standard interleaving. IS-95 interleaving is defined by two stages: write by column, and read by row. With the current invention, both functions are performed at the same time, i.e. before being written to the interleaver memory. With inverse interleaving, the entire 20 ms frame is built in the first pass, then portions of the frame are directly replaced by simply changing the write-address offset and over-writing the appropriate area of interleaver memory using a different set of interleaving parameters. For example, in the case of puncturing a 5 ms frame into a 20 ms frame, the 20 ms frame data is first interleaved and deposited in memory, after which the 5 ms frame is interleaved over the appropriate quadrant within the 20 ms frame within the memory. Thus, the entire buffer may be read out of the interleaver memory sequentially.

Simplified Interleaving

The interleaving function is simplified in accordance with the invention by consolidating the interleaving at the input side of the interleaver memory as will be discussed below. By doing so, data read from the interleaver memory may be accessed sequentially. The prior art of the IS-2000 standard indicates two interleaver structures in which interleaving is done when reading from the interleaver memory. Both of these interleaver structures need to be inverted to perform the complete interleaving function at the input side of the memory. The first interleaver described in the standard is required for backward compatibility with IS-95 systems, while the second meets the requirements of the IS-2000 standard. The following sections offer a detailed description of the inverse interleaving and output addressing.

IS-95 interleaver (and RC1 & RC2 of the IS-2000 standard)

Figure 2B:
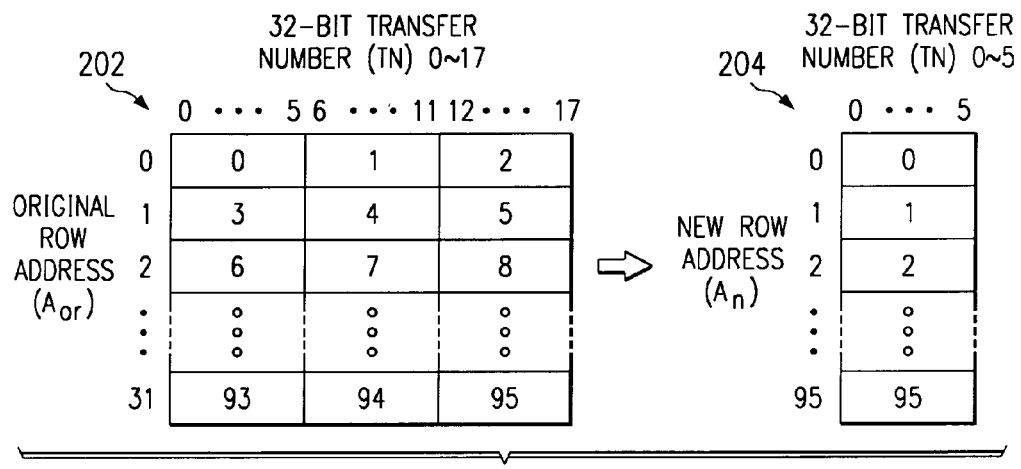
FIGS. 2A and 2B highlight the interleaving method used in the IS-2000 standard for IS95A/B interleaving.
Figure 2A:
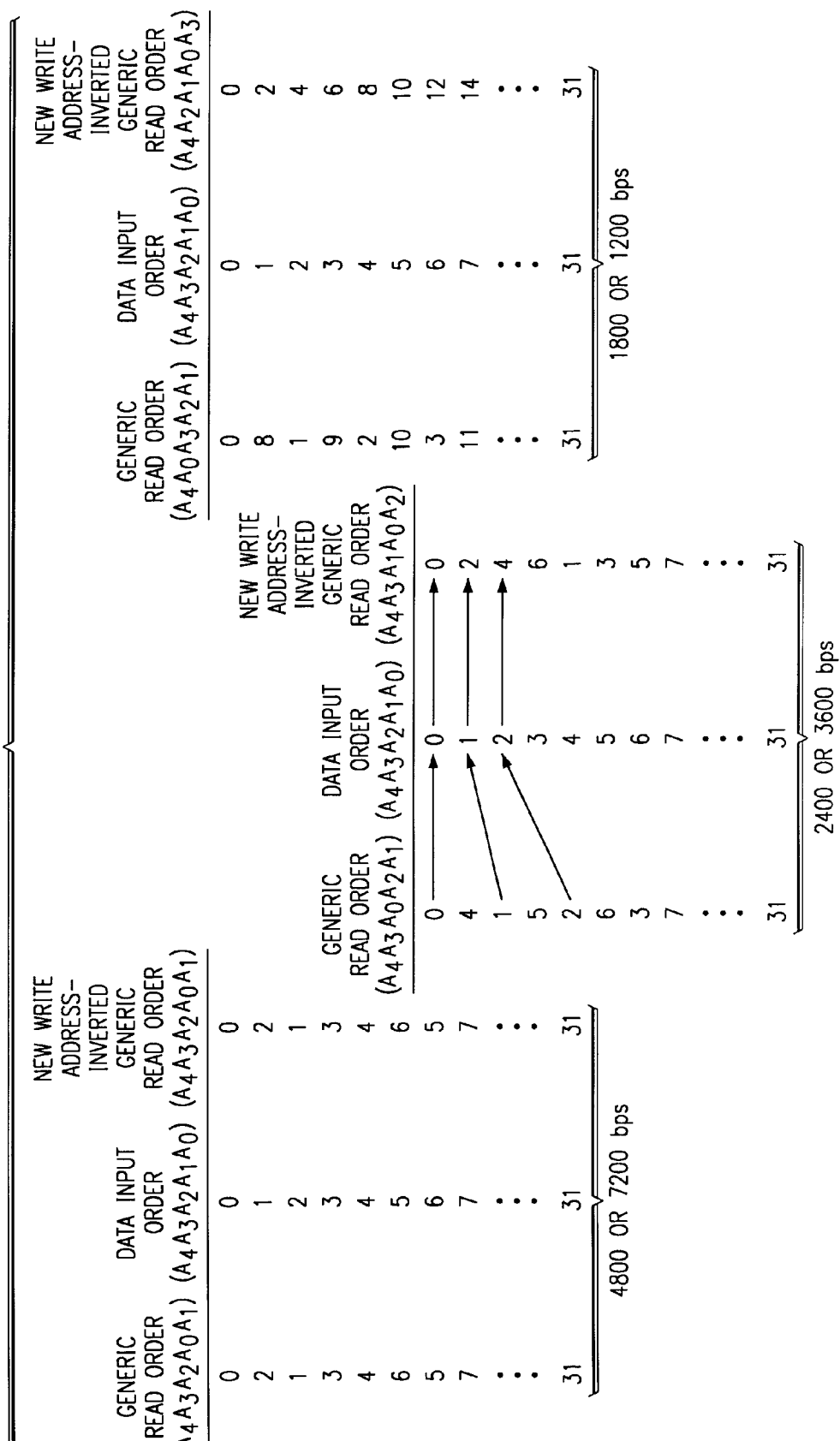

As shown in FIGS. 2A and 2B, the prior art interleaving method defined in the IS-2000 standard indicates writing data into a 32×18-memory array by column and then reading out from the array by row. In the standard, the read-row order is determined by swapping certain bits in a 5-bit sequential address as follows:
(1). For full rate (9600 or 14400 bps), there is no transformation. The address is applied sequentially: $A_4A_3A_2A_1A_0$
(2). For ½ rate (4800 or 7200 bps): $A_4A_3A_2A_0A_1$
(3). For ¼ rate (2400 or 3600 bps): $A_4A_3A_1A_0A_2$
(4). For ⅛ rate (1200 or 1800 bps): $A_4A_2A_1A_0A_3$
(5). For Access Channel: $A_0A_1A_2A_3A_4$ The objective of the interleaving is to accept input data sequentially in time, place it into the position in memory from which it should be read using a sequential addressing scheme. In other words, both write and read functions of the interleaver are merged into one function. FIG. 2A shows the mapping process of input data (by row) to its final read-ordered position in memory, if the memory were configured the way the algorithm is defined in the standard (32×18). The first column is the row read order given by the standard. The second column is the input order of the data, and the third is the new write address required to avoid read-row randomization (i.e., when reading from the interleaver memory).

For example, in the 2400/3600 bps example, looking at the "Data Input Order" column, it is shown that the $0^{th}$ input is read out first based on the standard algorithm (generic read order column). Therefore, it should be stored in New Write Address="0". The $1^{st}$ input is read out $3^{rd}$ so goes in New Write Address="2". The $2^{nd}$ input is read out second so belongs in New Write Address='1', and so forth.

Since the original algorithm states that data is written in 32-bit columns from top to bottom, as shown in FIG. 2B in table 202, and read out by interleaved row, it can be shown that the mapping process in FIG. 2A succeeds in re-ordering the rows so they can be read out sequentially yet still be interleaved properly. A re-mapping function is applied to a sequential input address generator in order to select the appropriate bit for each 32-bit input column.

Having re-mapped the position of the input data within each column denoted in table 202 as TN, we now have a 32×18 bit matrix of data. It is desirable to provide one six-bit value at each address in memory so as to simplify the retrieval of data by the output addressing mechanism (since six symbols are used every 256 PN chips). In order to accomplish this, each 18-bit word is remapped into three six-bit words, each at its own location in memory.

It is shown in table 202 that each 32-bit input in the original matrix must be further mapped into the format shown in table 204. Since the input data has already been mapped into read order, we now only have to determine the address location in memory that each value must be placed based on where it appears in the 32×18 matrix.

Each 18-bit word needs to be re-positioned into three six-bit words, each at its own location address. Inspection of the two matrices reveals the following relationship:

If $TN=0~5, A_n=A_{or}*3$;

If $TN=6~11, A_n=[A_{or}*3]+1$; (Equation 1)

Figure 3:
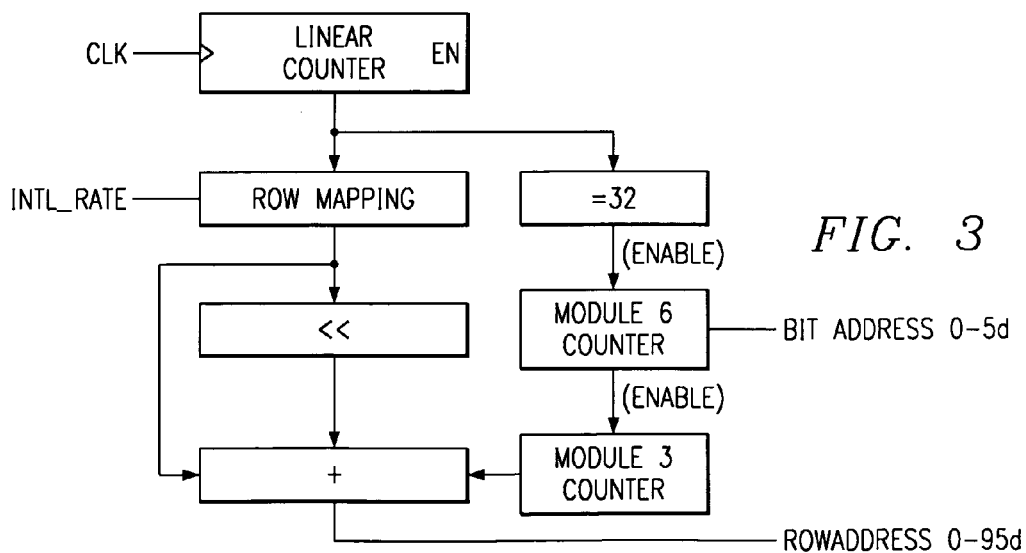
FIG. 3 shows an IS-95 interleaving in accordance with the invention.

If $TN=12~17, A_n=[A_{or}*3]+2$;

This observation means the remapped rows of FIG. 2A are further mapped as shown in equation 1 above. The implementation of the IS-95 interleaver shown in FIG. 3, includes a modulo 6 counter which indexes through the groups of six 32-bit columns. It also includes a multiply-by-3 (shift & add) block, and a modulo 3 result which is incremented after each 32×6 group has completed, which satisfies the offset shown in equation 1 above.

IS-2000 Interleaver (and RC3~6 of IS-2000)

The IS-2000 standard states that "the symbols input to the interleaver are written sequentially at addresses 0, to the block size (N) minus 1. Interleaved symbols are read out in a permutated order with the i-th symbol being read from address $A_i$, as follows:

$$A_i = 2^m(i \bmod J) + BRO_m\left(\left\lfloor \frac{i}{J} \right\rfloor\right) \quad \text{(Equation 2)}$$

where i=0 to N−1, $\lfloor x \rfloor$ indicates the largest integer less than or equal to x, and $BRO_m(y)$ indicates the bit-reversed m-bit value of y.

Figure 4:
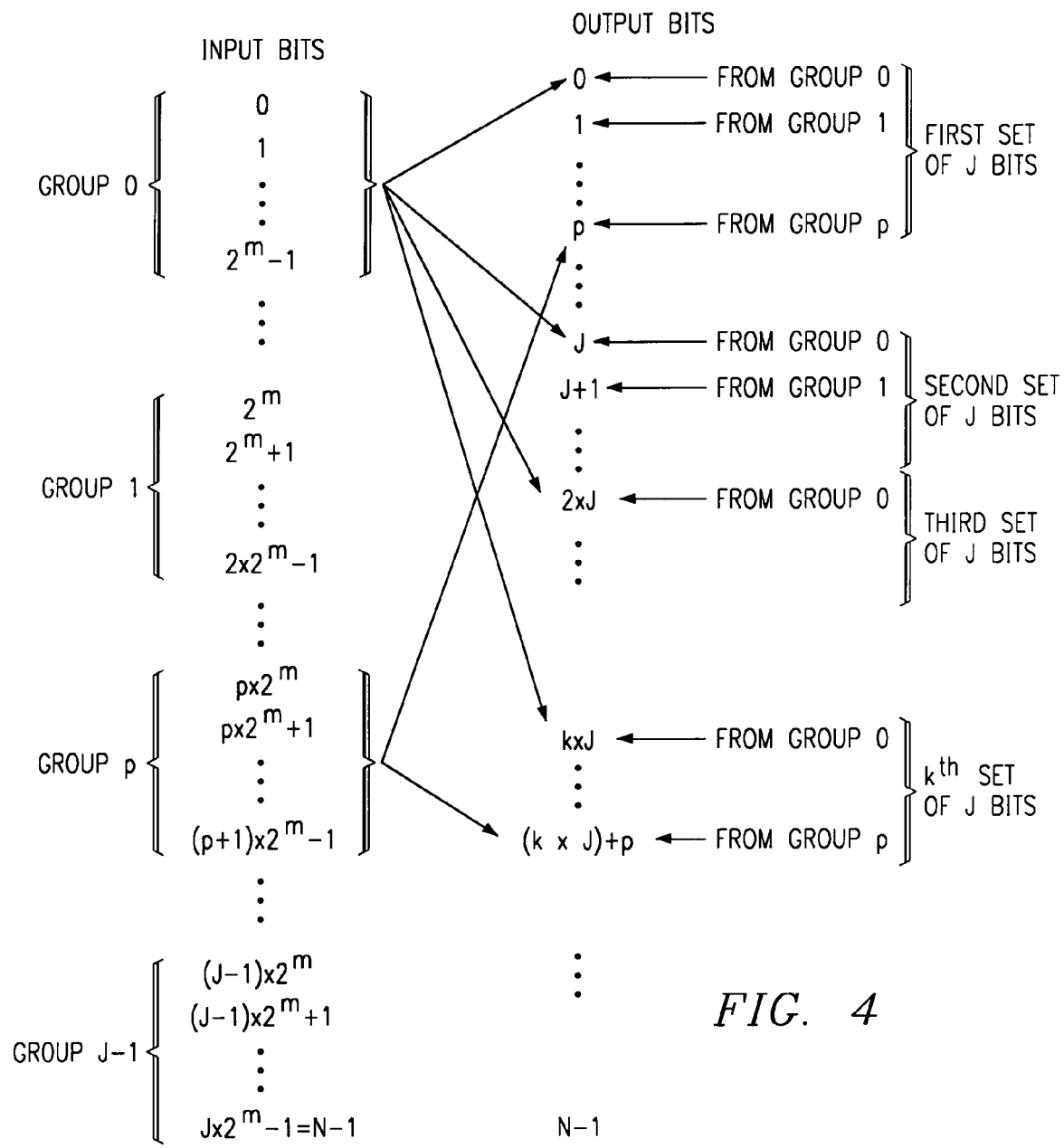
FIG. 4 shows the mapping from 'input-based interleaving' to 'output-based interleaving' in accordance with the invention.

In FIG. 4, it is shown how equation 2 works. The left column of FIG. 4, shows the linearly ordered input bits to the interleaver and the right column shows the linearly ordered output bits. FIG. 4 illustrates how linearly ordered bits that are received are store in such a way that they can be read linearly. FIG. 4 also shows that input bit addresses can be grouped by bunches of $2^m$ consecutive values and that output bit addresses will receive their inputs from groups of addresses in a sequence that repeats every J bits, hence modulo J. FIG. 4 however does not indicate which address inside a group is actually sent to the output column. This is the tricky part of the algorithm where the Bit Reversal comes into play.

Look at i within sets of J values, i.e. we apply an integer division of i by J; there exist two unique integers k and p such that:

$i=kJ+p$ with $0 \leq p \leq J-1$ and $k \geq 0$ (Equation 3)

Substituting Equation 3 into the first part of Equation 2 results in:

$$A_i = 2^m((kJ + p) \bmod J) + BRO_m\left(\left\lfloor \frac{i}{J} \right\rfloor\right)$$

$$A_i = (2^m \times p) + BRO_m\left(\left\lfloor \frac{i}{J} \right\rfloor\right) \quad \text{(Equation 4)}$$

By construction of the $BRO_m$ function, we have:

$0 \leq BRO_m(y) \leq 2^m-1$ (Equation 5)

since $BRO_m$ is an m-bit number. Combining Equations 4 and 5 and keeping in mind that p is positive, leads to the conclusion that p is the quotient of the integer (Euclidean) division of $A_i$ by $2^m$ and that $BRO_m(\lfloor i/J \rfloor)$ is the remainder.

We may already assert than an incoming bit in the $A_i$-th position will be read in the i-th position such that:

$i=kJ+p$ with $p=\lfloor A_i/2^m \rfloor$ (Equation 6)

but we do not know how to process k yet.

Substituting the value of i in Equation 3, into Equation 4 leads to:

$$A_i = (2^m \times p) + BRO_m\left(\left\lfloor \frac{(kJ + p)}{J} \right\rfloor\right) \quad \text{(Equation 7)}$$

The definition of k and p of Equation 3 implies that:

$$\left\lfloor \frac{(kJ+p)}{J} \right\rfloor = k \quad \text{(Equation 8)}$$

From Equations 7 and 8 we get:

$$A_i = (2^m \times p) + BRO_m(k) \quad \text{(Equation 9)}$$

Now, let q be the remainder of the division of $A_i$ by $2^m$:

$$q = A_i \bmod 2^m. \quad \text{(Equation 10)}$$

It has been shown that:

$$q = BRO_m\left(\left\lfloor \frac{i}{J} \right\rfloor\right) = BRO_m(k) \quad \text{(Equation 11)}$$

The Bit Reversal function has the obvious property that applied twice in a row it is equivalent to zero; hence:

$$BRO_m(q) = BRO_m[BRO_m(k)] = k \quad \text{(Equation 12)}$$

We have now come to the final conclusion, that the $A_i$-th input bit goes to the i-th address of the output table such that:

$$i = kJ + p \text{ with } p = \left\lfloor \frac{A_i}{2^m} \right\rfloor \text{ and } k = BRO_m(A_i \bmod 2^m) \quad \text{(Equation 13)}$$

It is worth mentioning that the J value is chosen in the IS-2000 standard to be of the form $J=3 \times 2^n$, where n is an integer. This makes the multiplication by J relatively easy to achieve.

Figure 5:
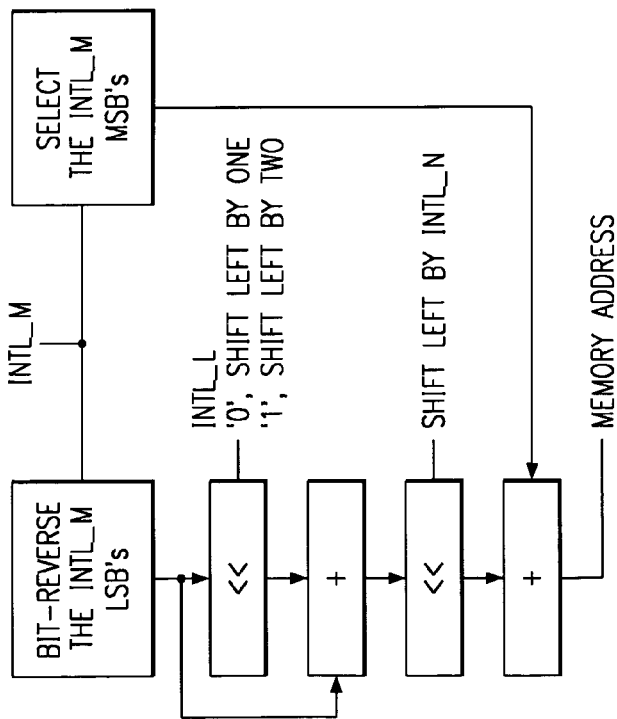
FIG. 5 shows an IS-2000 bit-exact interleaving implementation in accordance with the invention.
Figure 7:
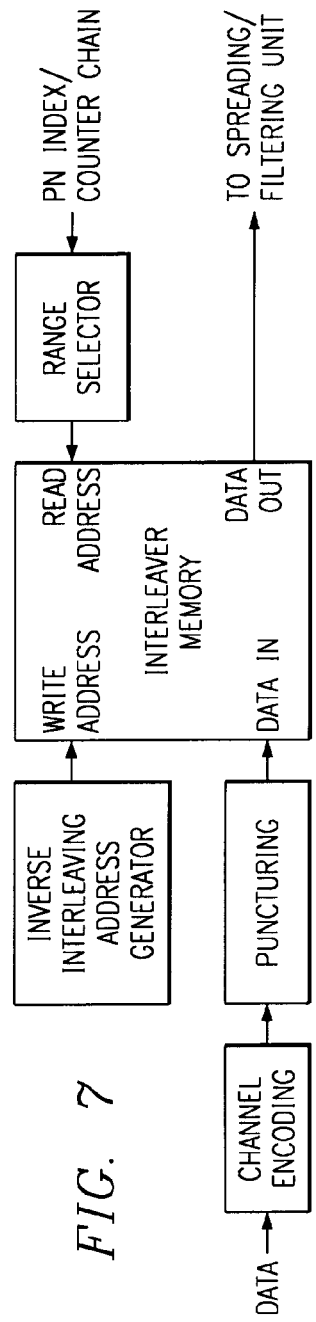
FIG. 7 shows a modulator in accordance with the present invention.

In FIG. 5, there is shown the hardware implementation of the inverse interleaver of IS-2000. The write address I, is given as:

$$I = kJ + P$$

where: J can be defined as $3*2^n$ or $9*2^n$ (i.e., as determined in tables 2.1.3.1.7-1 of the IS-2000 standard, J can be decomposed in this manner); $P = A_i/2^m$ and $A_i$ is the requested address; $k = BROm(A_i \bmod 2^m)$; $BROm(y) = $ bit-reversed m−LSBs of y. The assignable parameters are: INTL_M which is used for m; INTL_L is used as the 3 or 9 multiplier in J above; and INTL_N is used for n.

Use of offset addressing of a single contiguous interleaver memory provides the flexibility to engage different numbers of channels while easily configuring them for different rates. This flexibility allows the most efficient use of data path bandwidth since the memory may be used for multiple channels of varying data rates, or it may be consumed by a single high-data-rate channel. Additional flexibility can be leveraged since both input and output address offsets are applied allowing any channel to be assigned to any region within the interleaver memory. This provides for a simplified yet maximally flexible method for allocating multiple reverse link channels, each of programmable size within a single interleaver memory.

In the present invention, utilization of reverse link timing reference in the addressing of the interleaver memory for the transfer of data to the spreading/filtering unit. Output data is ultimately Walsh covered (RC3~6) or Walsh modulated (RC1~2) and PN-spread prior to transmission by a Walsh function block and PN sequence block respectively. An advantage can be gained if a simple counter tied to reverse link timing can be leveraged to address the interleaver memory.

Typical modulator front-ends require the interleaver memory to be tightly coupled to the interleaving function. For example, the IS-95A/B standards imply a two-stage interleaving process (write by row, read by column) that complicates the option of leveraging the counter mentioned above for output addressing. In addition, due to the punctured frame requirement of the IS-2000 standard, typical architectures will not be able to take advantage of the counter without first applying complicated manipulations to adjust for punctured frames.

Figure 6:
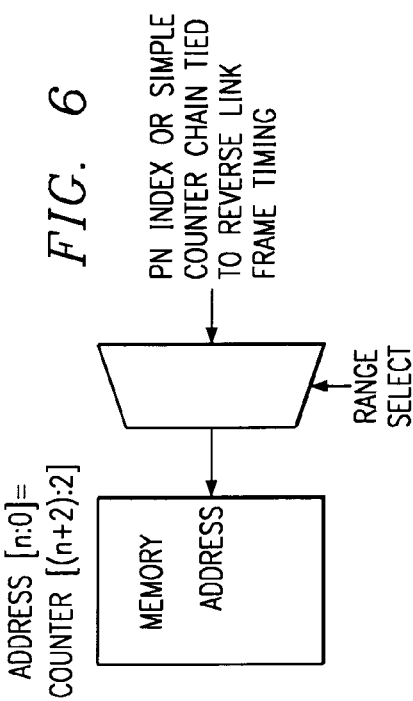
FIG. 6 shows illustrates a memory addressing technique in accordance with the invention.

FIG. 6 illustrates the method of output addressing of the memory in accordance with one aspect of the invention. Utilization of a counter tied to reverse link timing is possible because modulation data duration is given in terms of a finite number of pseudonoise (PN) chips, or 'Chips Per Modulation Symbol' (CPMS). Depending on the CPMS requirement for a particular frame of data, the addressing can be generated by simply selecting the appropriate range of the counter. Note that the counter changes state at the chip rate, meaning that if we were looking for a CPMS of four, we would select the lowest bit of addressing to correspond to the third bit of the counter: Address [n:0]=counter [(n+2):2].

As described above, the present invention provides for an extremely streamlined approach to achieving both methods of interleaving as defined in the IS-2000 standard, while meeting the complex requirement of frame puncturing in a straightforward manner. Since output addressing is directly driven by the PN index or a counter locked to the reverse link timing, it is a simple matter of range selection to achieve all possible configurations required in the IS-2000 standard.

While the prior art requires the use of complex counters, state machines, and terminal count parameters, to achieve the puncturing of sub-20 ms frames. It is easily accomplished via the use of a single contiguous memory and interleaver engine that resides on the input side of the interleaver memory as provided by the present invention. The overall structure of the approach taken in this invention affords maximum flexibility within a simplified architecture.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A modulator circuit comprising:
   a memory for storing interleaved data, the memory having a write address port and a read address input port;
   an inverse interleaving address generator coupled to the write address port; and
   a range selector circuit having an input port for receiving a pseudonoise (PN) index or a reverse link frame timing signal and an output port for providing a read address to the memory.

2. The modulator circuit of claim 1 in which the reverse link frame timing signal includes a counter signal, and the range selector circuit includes a range select input that selects a desired range of the counter signal.

3. The modulator circuit of claim 1 in which the reverse link frame timing signal includes a counter signal that changes state at a chip rate.

4. The modulator circuit of claim 1 in which the reverse link frame timing signal includes a counter signal, the range selector circuit includes a range select input that selects a desired range of the counter signal, and the output port of the range selector circuit provides a read address [n:0]=counter signal [(n+2):2].

* * * * *

UNITED STATES PATENT AND TRADEMARK OFFICE
CERTIFICATE OF CORRECTION

PATENT NO. : 7,586,993 B2 Page 1 of 1
APPLICATION NO. : 10/007087
DATED : September 8, 2009
INVENTOR(S) : Rastello et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1419 days.

Signed and Sealed this

Twenty-first Day of September, 2010

David J. Kappos
*Director of the United States Patent and Trademark Office*